United States Patent
Wu et al.

(10) Patent No.: US 7,505,319 B2
(45) Date of Patent: Mar. 17, 2009

(54) METHOD AND APPARATUS FOR HIGH EFFICIENCY REDUNDANCY SCHEME FOR MULTI-SEGMENT SRAM

(75) Inventors: Jui-Jen Wu, Hsinchu (TW); Yung-Lung Lin, Taichung (TW); Yen-Huei Chen, Hsinchu (TW); Dao-Ping Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 161 days.

(21) Appl. No.: 11/669,667

(22) Filed: Jan. 31, 2007

(65) Prior Publication Data

US 2008/0184064 A1 Jul. 31, 2008

(51) Int. Cl.
*G11C 11/34* (2006.01)
(52) U.S. Cl. ............ 365/185.09; 365/200; 365/189.011
(58) Field of Classification Search ............ 365/185.09, 365/200, 189.011
See application file for complete search history.

(56) References Cited

U.S. PATENT DOCUMENTS

| | | | |
|---|---|---|---|
| 4,045,785 A | 8/1977 | Kirkpatrick, Jr. | |
| 6,560,743 B2 | 5/2003 | Plants | |
| 6,618,301 B2 | 9/2003 | Chou | |
| 6,694,448 B2 | 2/2004 | Callahan | |
| 6,885,596 B2 * | 4/2005 | Asano et al. ................ 365/200 |
| 6,930,934 B2 | 8/2005 | Wang | |
| 6,944,075 B1 | 9/2005 | Eustis et al. | |

\* cited by examiner

*Primary Examiner*—Son Dinh
*Assistant Examiner*—Nam Nguyen
(74) *Attorney, Agent, or Firm*—Duane Morris LLP

(57) ABSTRACT

The disclosure generally relates to a method and apparatus for a high efficiency redundancy scheme for a memory system. In one embodiment, the disclosure relates to a memory circuit having: a memory array defined by a plurality of memory cells arranged in one or more columns and one or more rows, each memory cell communicating with one of a pair of complementary bit-lines and with a word-line; a plurality of IO circuits, each IO circuit associated with one of the plurality of memory cell columns; a plurality of redundant bit-lines, each redundant bit line communicating with a redundant bit cell; a first circuit for detecting a defective memory cell in said memory circuit; a second circuit for selecting one of the plurality of redundant bit-lines for switching from the failed memory cell to the redundant memory cell; and a third circuit for directing a word-line pulse of said defective memory cell to said selected redundant memory cell.

31 Claims, 7 Drawing Sheets

METHOD AND APPARATUS FOR HIGH EFFICIENCY REDUNDANCY SCHEME FOR MULTI-SEGMENT SRAM

The disclosure generally relates to memory systems. More specifically, the disclosure relates to a method and apparatus for a high efficiency redundancy scheme for a memory system.

BACKGROUND

Semiconductor memories are composed of large arrays of individual cells. Each cell stores a 1 or 0 bit of data as an electrical high or low voltage state. Conventionally 8 bits may compose a byte of data and at least 16 bits may compose a word. In each memory operation cycle, at least one byte is typically written into or read from the array. Cells are arranged at the crossings of vertical data, or bit-lines, and horizontal word-lines or address lines. The word-lines enable reading or writing operation. A read or write cycle occurs when a word-line, as well as a pair of bit-lines, are activated. The cell accessed at the intersection of the word-line and the bit-lines will either receive written data from the bit-lines, or will deliver written data to the bit-lines. Cells can be accessed in random order. A cell may also be accessed directly based on its location in the memory circuit.

A memory cell is composed of an electronic circuit, typically including transistors. A Static Random Access Memory (SRAM) memory cell is conventionally composed of a plurality of metal-oxide-semiconductor field-effect-transistors (MOSFETs). The most common type of SRAM is composed of six-transistor (6T) cells, each of which includes two P-type MOSFETs (PMOSFETs) and four N-type MOSFETs (NMOSFETs). A cell is arranged with two inverters that are accessed from two complementary bit-lines through two access transistors controlled by a word-line. Such structures have low power consumption and provide immunity to electronic noise.

FIG. 1 illustrates a conventional six-transistor SRAM cell 100. Specifically, FIG. 1 illustrates a six-transistor SRAM cell 100 with two additional resistors 102 and 104. Pull-up transistor PU-1 and pull-down transistor PD-1 form inverter INV-1. Similarly, pull-up transistor PU-2 and pull-down transistor PD-2 form inverter INV-2. Each of these resistors is placed between one inverter output node and the gates of the opposite inverter. From Node-2, a resistor 102 is in series with the parallel combination of the gate-to-substrate capacitance of a pull-up transistor PU-1 and of a pull-down transistor PD-1. From Node-1, a resistor 104 is in series with the parallel combination of the gate-to-substrate capacitance of a pull-up transistor PU-2 and of a pull-down transistor PD-2. Node-2 is also connected, through a pass-gate transistor PG-2, to bit-line bar BLB. Node-1 is also connected, through a pass-gate transistor PG-1 to bit-line BL. Pass-gate transistors PG-1 and PG-2 are switched by the word-line WL.

To avoid memory failure, each memory cell is configured to have a redundant memory arrangement nearby. Typically, the redundancy is in the form of a memory segment having several rows and columns of memory cells. In some embodiments, a row or column of memory cells is typically accompanied by a row or column of redundant memory cells. Thus, when a memory cell fails, a segment containing the defective memory cell is replaced with a redundant memory segment. The redundant memory segment are positioned near the applicable memory cells to male replacement easily accessible. In the event of a memory cell failure, the datum is directed to a corresponding redundant cell.

As memory systems continuously increase in size and complexity, the number of redundant memory segments also increases to accommodate a larger number of potentially defective cells. Redundant cells are typically allocated to a region of the memory circuit and a redundant memory segment in the closest proximity to the defective cell may be selected as a replacement. In certain designs, the redundant memory segments are added to the end of the region where the memory cells are housed. In the event of a memory cell failure, the information is directed to the redundant memory segment at the end of the memory region to replace the entire segment containing the defective cell.

However, as more technologies that utilize semiconductor memories require a smaller footprint and a higher mobility, space saving in semiconductor memory designs becomes increasingly important. In particular, in order to continually achieve size and performance advantages, cell geometries must continually shrink. Because of the one-to-one relationship between memory cells and their redundant regions, a larger memory size has been accompanied by a larger redundant region.

SUMMARY OF THE DISCLOSURE

In one embodiment, the disclosure relates to a memory circuit comprising: a memory array defined by a plurality of memory cells arranged in one or more columns and one or more rows, each memory cell communicating with one of a pair of complementary bit-lines and with a word-line; a plurality of IO circuits, each IO circuit associated with one of the plurality of memory cell columns; a plurality of redundant bit-lines, each redundant bit line communicating with a redundant bit cell; a first circuit for detecting a defective memory cell in said memory circuit; a second circuit for selecting one of the plurality of redundant bit-lines for switching from the failed memory cell to the redundant memory cell; and a third circuit for directing a word-line pulse of said defective memory cell to said selected redundant memory cell.

In another embodiment, the disclosure relates to a method for providing redundancy in a memory system comprising: providing a memory segment defined by a plurality of memory cells arranged in one or more columns and one or more rows, each memory cell communicating with one of a pair of complementary bit-lines and with a word-line; detecting a defective memory cell in said memory segment; identifying and selecting a redundant bit-line from among a plurality of redundant bit-lines; and replacing the defective memory cell by directing a redundant word-line pulse to the redundant memory cell communicating with the selected redundant bit line.

In one embodiment, the disclosure relates to an apparatus for detecting an addressing error in data stored in a static ram configuration, the apparatus comprising: a plurality of main memory array for storing data, each memory array having at least one memory cell in communication with a word-line and one of a pair of complementary bit-lines; a plurality of redundant bit-cells to replace a defective memory cell; a control circuit configured to transmit a replacement word signal to a selected redundant bit-line from the plurality of redundant bit-lines, the selected redundant bit-line and the replacement word line defining a redundant memory cell; wherein the control circuit further includes a flash memory for storing the address of the defective memory and a comparator for directing the replacement signal to the redundant bit-line.

DETAILED DESCRIPTION

Figure 1:
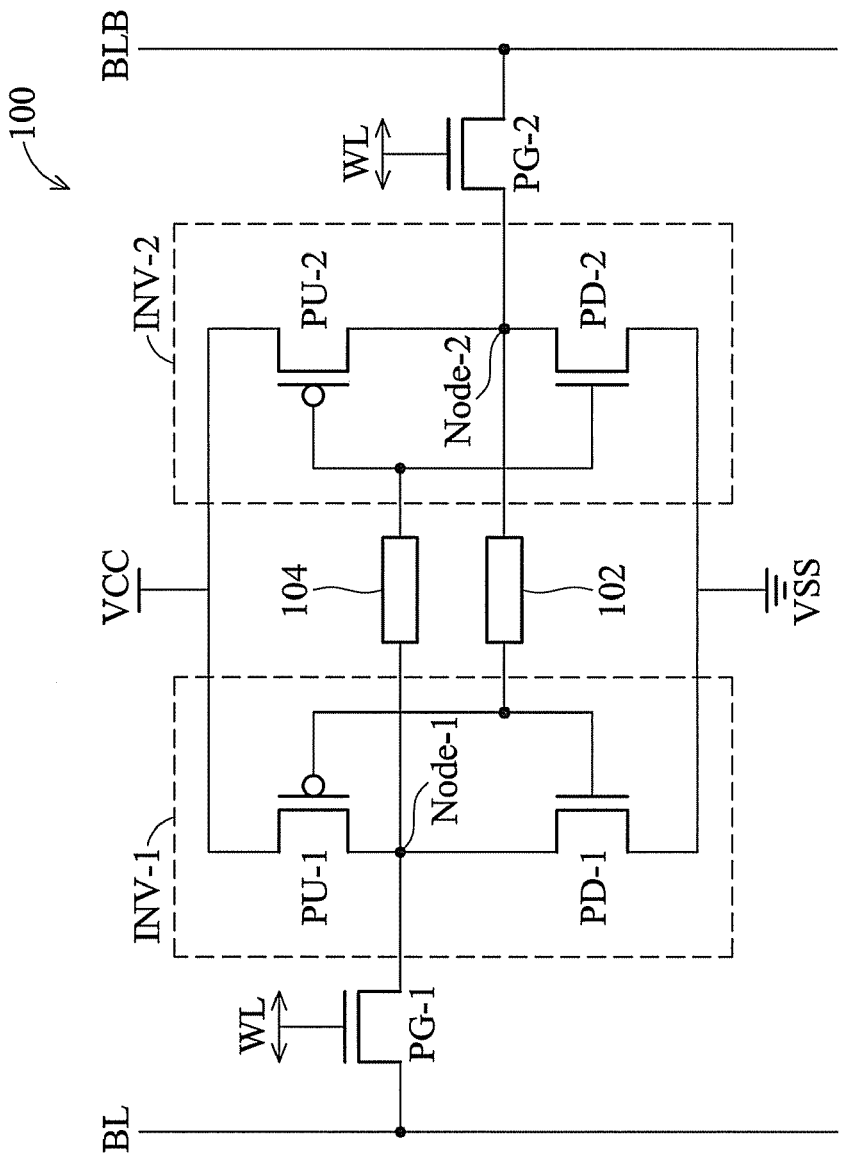
FIG. 1 is a schematic diagram of a conventional six-transistor SRAM cell with two additional resistors.
Figure 2A:
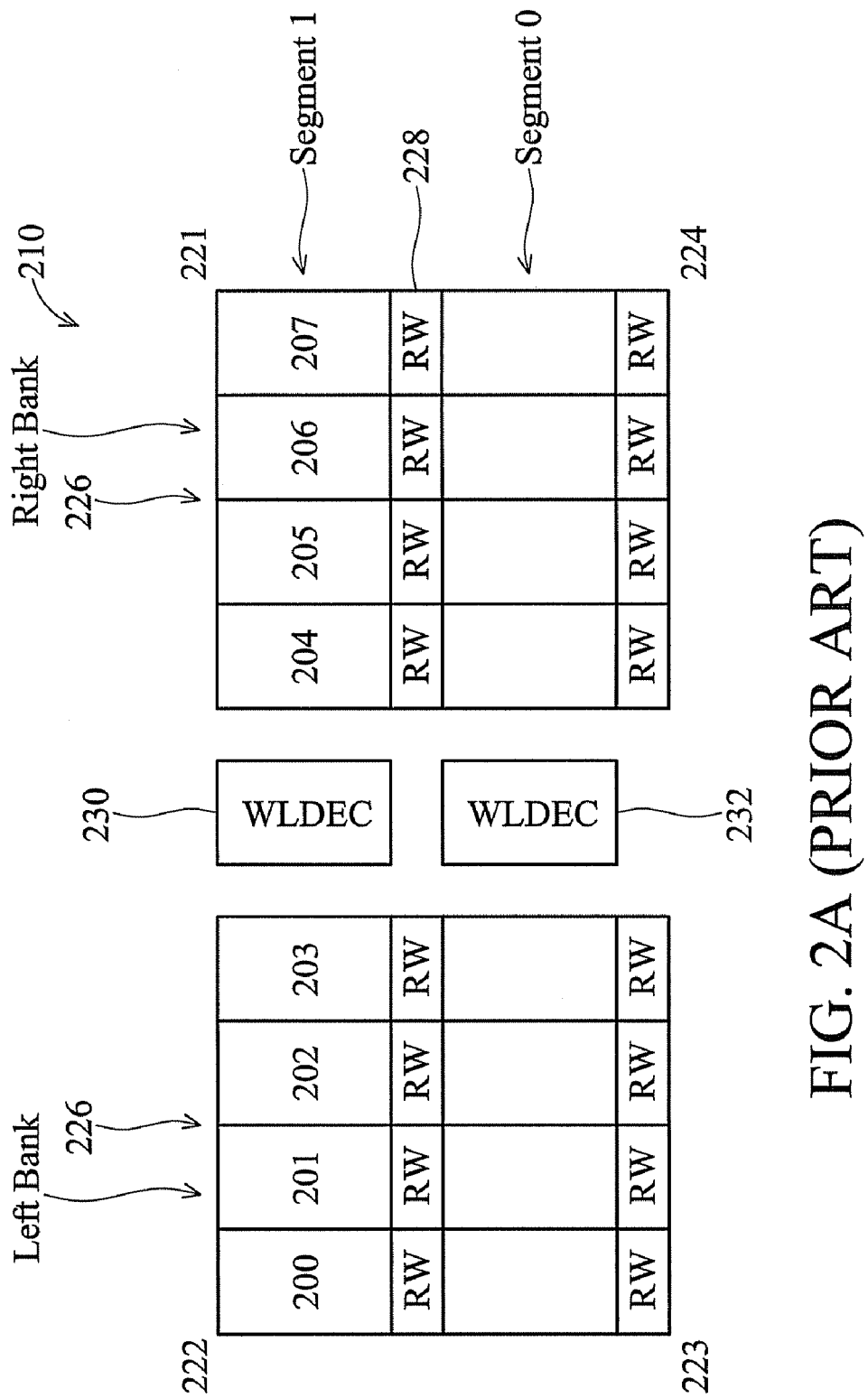
FIG. 2A is a schematic representation of a conventional memory allocation in a memory system.

FIG. 2A is a schematic representation of a conventional memory allocation in a memory system. The memory system 210 includes four memory arrays 221, 222, 223 and 224. A pair of adjacent memory arrays such as 221 and 224 form a memory segment 226. Memory segment 226 includes eight IO arrays 200 through 207. Also, segment 226 includes a left bank and a right bank appearing on the left- and right-hand sides of FIG. 2A. Each IO array 200-207 is in communication with a Read-Write (RW) circuit 228. Word line Decoders (WLDEC) 230 and 232 are positioned near adjacent memory arrays to provide word line signal to each respective memory arrays. Word line decoders 230 and 232 decode (i.e., identify) the memory cell address.

Figure 2B:
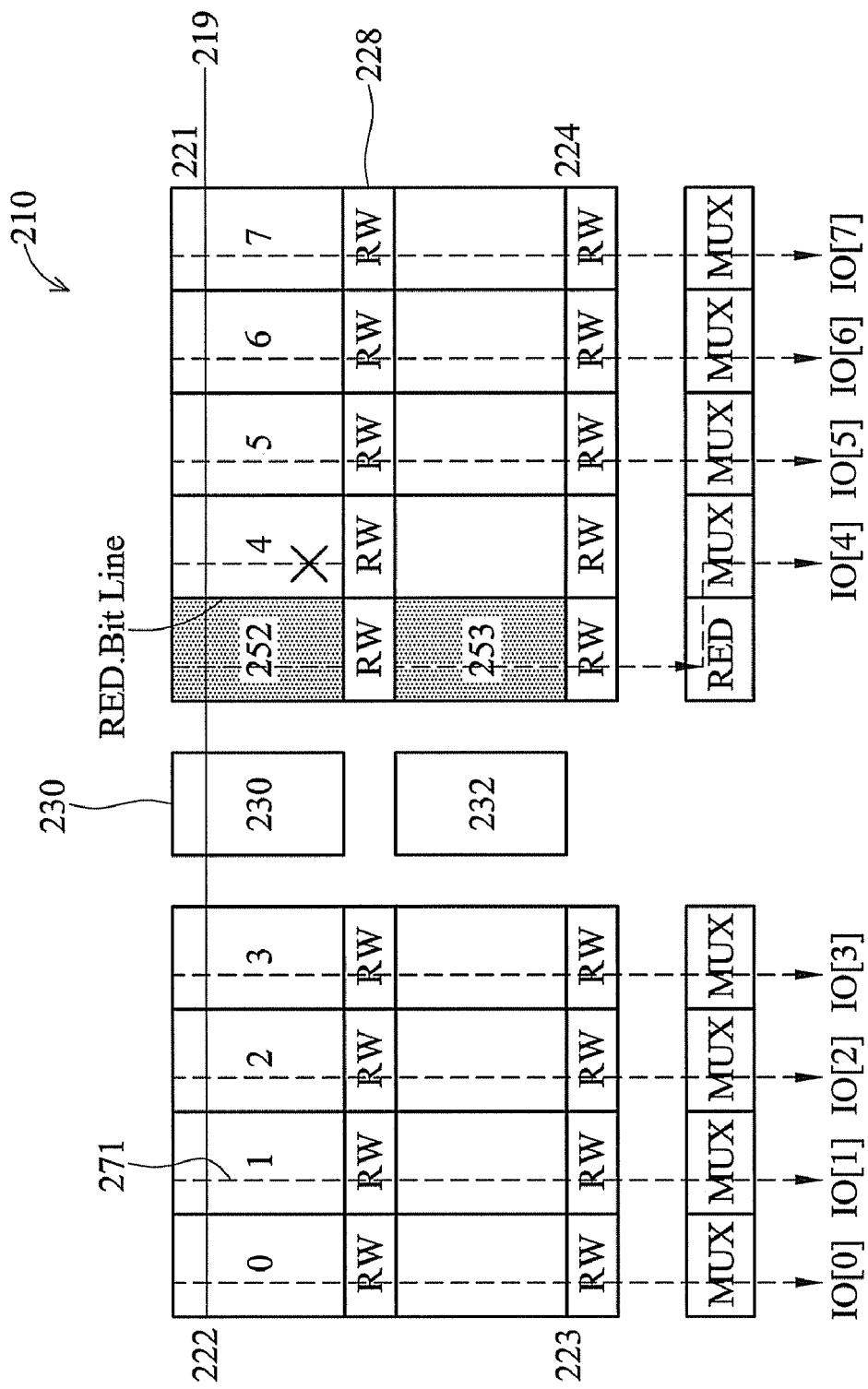
FIG. 2B is a schematic representation of a conventional memory allocation system having a redundant memory segment.

FIG. 2B is a schematic representation of a conventional memory allocation system having a redundant memory segment. In FIG. 2B, redundant IO array 252 and 253 are shown adjacent to memory arrays 221 and 224, respectively. Further, each memory column 0-7 is shown with a bit line within each IO array. Although each memory IO array may include more than one bit line, for simplicity, only one bit line is shown. Each memory column 0-7 communicates with a corresponding IO multiplexer IO[0] through IO[7] and a corresponding Read-Write (RW) circuit 228. For example, bit-line 271 from memory segment 222 is directed to a RW control circuit and to IO[1]. In the event of a memory failure (e.g., memory cell 4 of memory segment 221), a conventional memory system would substitute a redundant memory segment (e.g., redundant segment 252) for the memory segment 221. In such substitution, active word-line 219 is directed to redundant segment 252 and the RW signal associated with redundant segment 252 is directed through redundancy circuit RED to IO [4]. In conventional redundancy scheme, the failed bit-line 4 can only be replaced by redundancy BL within array 252, the redundancy BL within array 253 cannot repair failed bit-line 4. Because the active word-line must drive the same row and segment. Thus, the repaired efficiency is low. Applicant incorporates herein U.S. Pat. No. 6,930,934 B2, issued Aug. 16, 2005 (entitled: "High Efficiency Redundancy Architecture in SRAM Compiler"), and assigned to the assignee of the instant application, in its entirety for background information.

It can be readily seen that designating a redundancy segment 252 for each memory array 221, 222, 223 and 224 requires an inefficient memory allocation. To overcome these and other deficiencies, an embodiment of the disclosure relates to replacing the redundant array with a smaller region having one or more redundant bit-lines associated with one or more redundant bit cells (interchangeably, IO array). The bit-line can define a cell structure within the array. In another embodiment of the disclosure, one or more redundant bit-lines (and bit cells) can be added to the array area controlled by each RW circuit. In still another embodiment, the conventional redundant I/O arrays replaced by one or more cells having redundant bit-lines which can be readily accessed in the event of a memory cell failure. In still another embodiment, the redundant bit-lines can replace any defective memory cell regardless of its location within the circuit. In still another embodiment, the a failed bit-line (e.g., BL 4) can be repaired by redundancy bit-line within segment 252 or segment 253.

Figure 3:
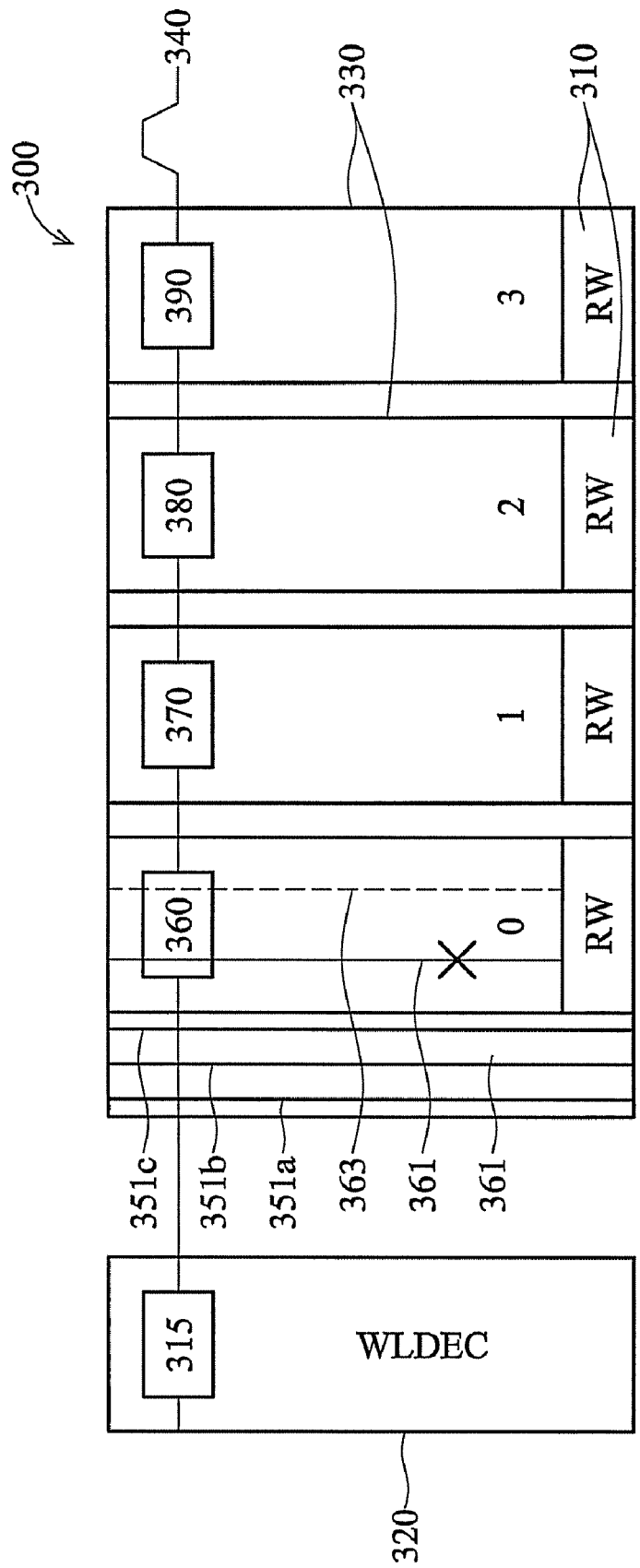
FIG. 3 is a schematic representation of a memory cell allocation according to one embodiment of the disclosure.

FIG. 3 is a schematic representation of a memory cell allocation according to one embodiment of the disclosure. In FIG. 3, array 300 includes four memory columns 330, numbered from left to right as columns 0, 1, 2, 3 and 4. Each memory column 330 communicates with a corresponding RW circuit 310. Each memory column 330 can comprise one or more memory cells. Word-line decoder 320 is positioned adjacent to the memory array 300. For simplicity, an exemplary word-line 340 is also shown in connection with the memory array 300. According to one embodiment of the disclosure, a region 350 is accorded to redundant bit-lines 351a, 351b and 351c. Each redundant bit line 351a, 351b or 351c may comprise a redundant memory cell. The redundant region 350 can be substantially smaller than the regions dedicated to redundant columns 212 in the conventional memory arrays 200. While each memory column 330 may comprise multiple memory cells, only memory cells 360, 370, 380 and 390 are shown. Further, while each of the memory cells 360, 370, 380 and 390 receives a bit-line and a complementary bit-line, for simplicity only memory cell 360 is shown with bit-line 361 and complementary bit-line 363.

Should bit-line 361 fail, for example, memory cell 360 would fail. To address the failure according to one embodiment of the disclosure, redundant bit-line 351a, for example, would be selected to replace the failed memory cell 360. To this end, word line 340 corresponding to defective memory 360 can be directed to redundant cell 351a to tale the place of the defective memory cell. The operation of redundant memory cell 351a will be described below. The illustration of FIG. 3 is exemplary in nature and it should be noted that any of the redundant bit-lines 351a, 351b or 351c may substitute for the bit line of any of the memory cells 360, 370, 380 and 390, in the event of a bit-line failure.

As stated, the redundant region 350 may comprise one or more redundant bit-lines 351a, 351b and 351c to enable the memory system to continue operation even after a bit-line failure has been detected. According to one embodiment, a control circuit first identifies a defective memory cell and its associated bit-line (including complementary bit-line) and word-line. The control circuit can then identify and select a redundant bit-line. (The term "redundant bit line" is used interchangeably with "redundant bit cell", because switching the word line connection from the failed bit line to the redundant bit line also connects the word line to the redundant bit cell in place of the failed bit cell.) Selection of the redundant bit line replaces the failed bit line, and therefore replaces the defective memory cell. Next, the control circuit can direct a redundant word-line pulse to a RW control circuit in communication with the redundant bit-line. The redundant word-line pulse may be substantially identical to the word-line pulse associated with the defective memory cell. Thus, the RW control circuit in combination with the redundant bit cells and word-line can replace the defective memory cell.

Figure 4A:
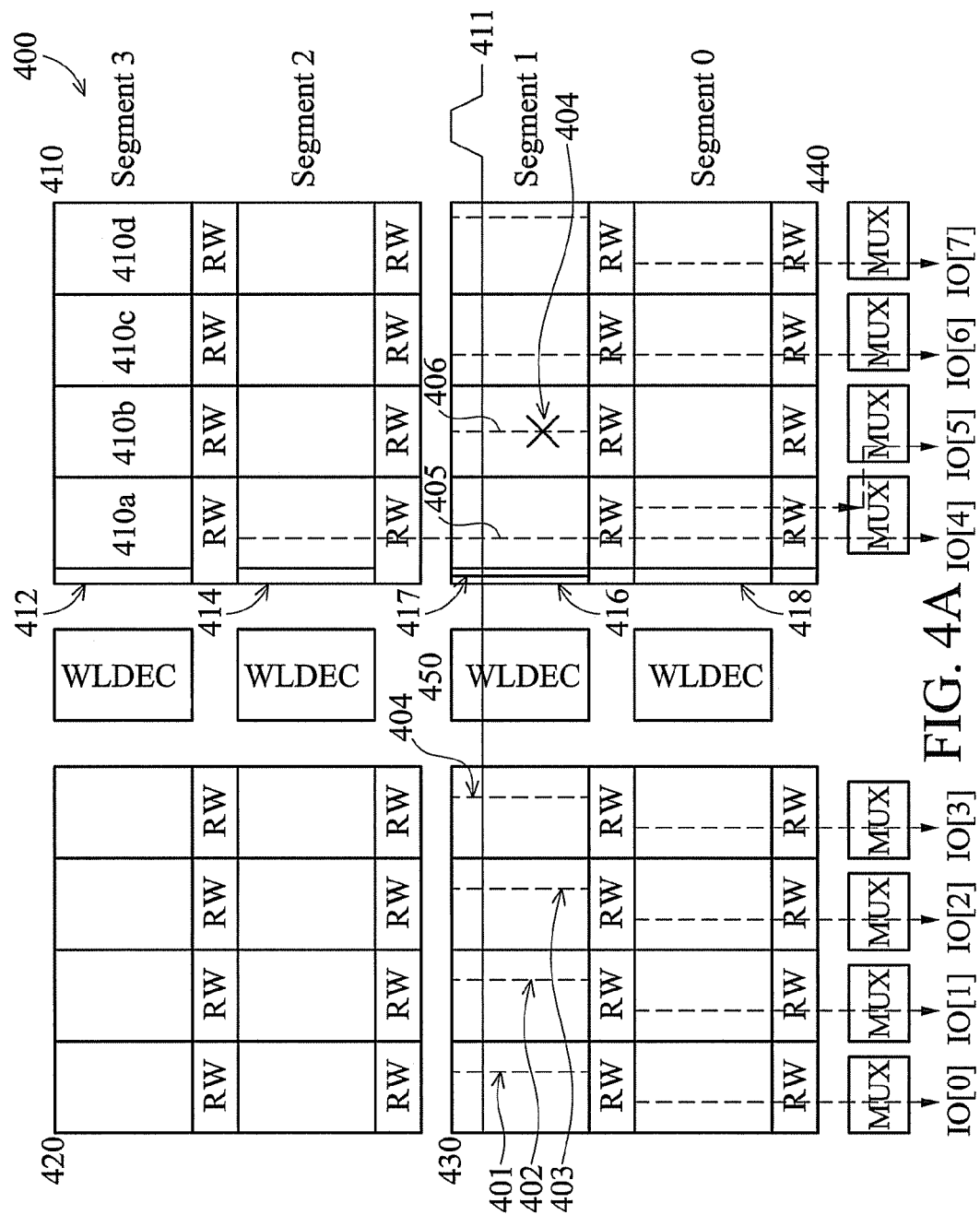
FIGS. 4A and 4B show exemplary memory circuits.
Figure 4B:
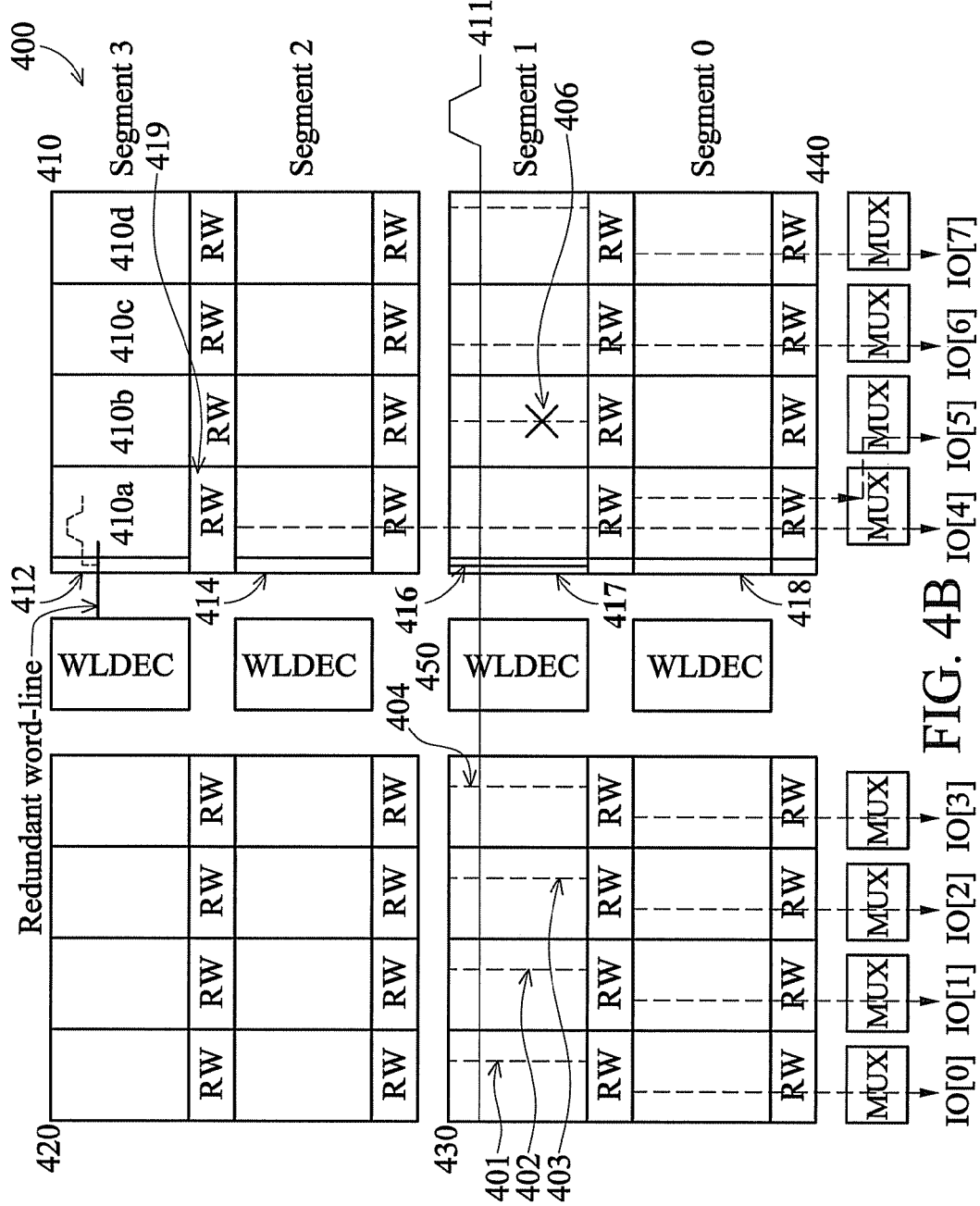

FIGS. 4A and 4B show exemplary memory circuits. Referring to FIG. 4A, memory system 400 is shown with arrays 410, 420, 430 and 440. A pair of horizontal arrays form a segment as noted in FIG. 4A. Thus, FIG. 4A is an example of four segments bit-line design. Each memory array includes four memory columns. For example, memory array 410 is shown with memory columns 410a, 410b, 410c and 410d. Each memory column includes a number of bit-lines and word-lines. For simplicity, only word-line 411 is shown (see memory segments 430 and 440) with generally one bit-line per column. For example, bit-lines 401-404 are shown for each column of memory array 430. Each bit-line 401, 402, 403 and 404 communicates with a respective RW circuit, and each RW circuit, in turn communicates with one of the IO circuits, numbered IO[0] to IO[3]. Word-line decoders (WLDEC) 450 are positioned along each memory column to provide a WL pulse signal to each memory cell. The WLDEC can be a control circuit for a pre-decoding processing step. That is, WLDEC can decode the address for the memory cell and determines which cell to select.

In one embodiment of the disclosure, redundant bit-lines (or bit-cells) are placed in regions 412, 414, 416 and 418 of the memory system 400. As the schematic illustration of FIG. 4A shows, the space allocated to the redundant bit-lines may be substantially smaller than the conventional space allocated to replacement columns.

In FIG. 4A, each of the redundant regions 412, 414, 416 and 418 communicates with a corresponding RW circuit. In one example, in memory array 440, the memory cell associated with bit-line 406 is defective due to bit-line failure. To remedy the failure, and according to one embodiment of the disclosure, once a defective memory cell is identified, one or more redundant bit cells from region 416 are selected to replace the defective memory cell associated with bit-line 406. Once the redundant bit cells are selected, a redundant WL pulse can be used to address the redundant bit cell. The redundant WL pulse can be substantially identical to the WL pulse signal provided to the defective memory cell.

In another embodiment, the WL pulse can be directed away from the defective memory cell to the redundant region. Referring to FIG. 4B, each of the redundant regions 412, 414, 416 and 418 and corresponding normal IO array share the same RW circuit. In this example, the memory cell associated with bit-line 406 suffers a bit-line failure due to defective cell. To remedy the failure, once a defective bit-line is identified, one or more redundant bit-lines from region 412, 414, 416 and 418 are selected to replace the defective memory cell associated with bit-line 406. Once the redundant bit-line is selected, a redundant WL pulse can be used to address the redundant bit cell. The redundant WL pulse can be substantially identical to the WL pulse signal provided to the defective memory cell. The RW circuit 419 read out the redundant bit-line 412 and flow to IO[4] MUX 420 and the redundant bit-line data is redirected to IO[5]. The MUX buffers out the 405 bit-line data to IO[4] and redirect the redundant bit-line data to IO[4] which is used to replace defective bit-line 406. Thus, according to one embodiment of the disclosure, the defective bit-line can be replaced by different segment.

The WL Decoder (WLDEC) circuit 450 is positioned near memory segment 440. The WLDEC circuit in combination with the redundant WL pulse and the redundant bit cell 417 can form a suitable substitute for the defective memory cell connected to failed bit line 406. WLDEC provides word-line pulses to memory cells. The output from the redundant bit-line 417 can be directed through circuit IO[4] to circuit IO[5] as described. Thus, circuit IO[5] can receive bit-line information which would have been otherwise provided by the defective memory cell associated with circuit IO[4].

The embodiment of FIG. 4B can enable memory circuit 400 to switch in a redundant bit cell to respond to a bit-line failure in any memory cell. That is, the redundant bit cells can be substituted for a failed cell in the event of a failure in any memory segment whether or not the failure occurs at a region proximate to the redundant regions 412, 414, 416, 418. For example, a redundant region 418 can be used to provide redundancy for defective bit line 406 (and its memory cell), which is separated from region 418 by another memory cell.

Figure 5:
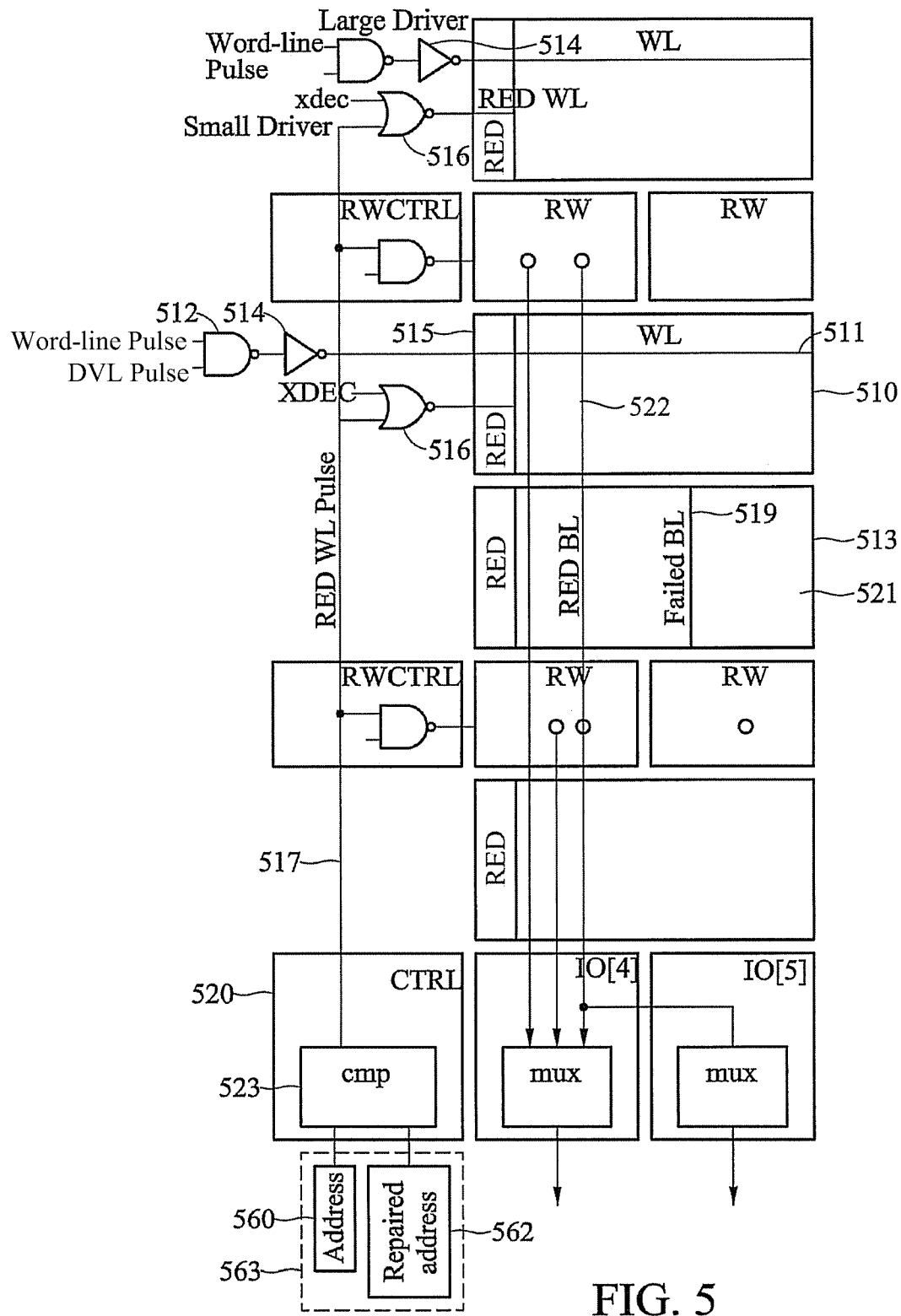
FIG. 5 is a schematic representation of a redundancy circuit according to one embodiment of the disclosure.

FIG. 5 is a schematic representation of a redundancy circuit according to one embodiment of the disclosure. Specifically, FIG. 5 illustrates the redundancy circuit which can be used in the memory circuit 400 of FIG. 4. Referring to FIG. 5, memory segment 510 is shown with region 515 having redundant bit-lines 522. In one embodiment of the disclosure, the exemplary redundant bit-lines define redundant bit cells. The NAND gate 512 and large driver (inverter) 514 generate WL pulse 511 associated with memory segment 510. A word-line pulse signal is an input to NAND-gate 512 along with WL address.

A parity circuit (not shown) can determine the location of failed bit-line 519. Once determined, the address 560 of failed bit-line 519 (or the memory cell associated therewith) can be stored in memory 563. The repaired address is stored in Repaired Address field 562. The comparator 523 compares SRAM input address with the Repaired Address and a redundant hitting control signal is generated if the input address is matched. Memory 563 can be any suitable 1e form of memory such as a shift register, ROM or flash memory. Memory 563 can be an auxiliary memory or it can be made part of controller 520. The address of the defective cell can be provided to Repaired Address 562 in memory 563. Next, comparator 523 can compare a desired address with the repaired address. If the desired address matches the repaired address, comparator 523 sends out a RED WL pulse to control RWCTRLs. This pulse can also be transmitted to smaller driver 516. This pulse identifies the memory cell to be read, by controlling whether the normal bit line or the redundant bit line is used. The small driver 516 can process a signal transmitted from an X-decoder and the RED WL pulse to select a redundant bit cell in the redundant array.

The RED WL Pulse can then trigger RWCTRLs so that a signal generated from the redundant bit cell can be transmitted to IO[0]. Since the failed bit line 519 is disabled, IO[4] will not receive a signal directly therefrom. Instead, the replacement signal generated from the redundant bit cell 515 is passed through IO[4] to IO[5]. A signal generated from a bit cell 522 corresponding to IO[4], however, is not shifted and is directed to IO[4]. Thus, each signal is transmitted to the corresponding I/O circuit without interruption.

In a method according to one embodiment of the disclosure, a defective memory cell is first identified and its address is stored in an auxiliary memory. Next, one or more redundant bit-lines are selected. The redundant bit-lines, in combination with a redundant word-line is then used to replace the defective memory cell. The memory cell can be defined by an SRAM architecture.

The embodiments disclosed herein are exemplary in nature and are used to illustrate the principles disclosed herein. The scope of the principles disclosed herein are not limited to these exemplary embodiments.

What is claimed is:

1. A memory circuit comprising:
    a memory array defined by a plurality of memory cells arranged in one or more columns and one or more rows, each memory cell communicating with one of a pair of complementary bit-lines and with a word-line;
a plurality of IO circuits, each IO circuit associated with one of the plurality of memory cell columns;
a plurality of redundant bit-lines, each redundant bit line communicating with a redundant bit cell;
a first circuit for detecting a defective memory cell in said memory circuit;
a second circuit for selecting one of the plurality of redundant bit-lines for switching from the defective memory cell to one of the redundant bit cells; and
a third circuit for directing a word-line pulse of said defective memory cell to said selected redundant bit cell.

2. The memory circuit of claim 1, wherein the redundant bit cell replaces the defective memory cell without replacing the memory array associated with the defective memory cell.

3. The memory circuit of claim 1, wherein the redundant bit cell replaces the defective memory cell without replacing the memory column associated with the defective memory cell.

4. The memory circuit of claim 1, wherein the third circuit is configured to generate a redundant word-line pulse.

5. The memory circuit of claim 1, wherein the first and the second circuits are included in a single circuit.

6. The memory circuit of claim 1, further comprising a fourth circuit for directing an output of the selected redundant bit-line to an IO circuit associated with the defective memory cell.

7. The memory circuit of claim 1, further comprising a multiplexing circuit for directing an output of the redundant bit-line to an IO circuit associated with the defective memory cell.

8. The memory circuit of claim 1, wherein the memory circuit defines a static random access memory (SRAM) system.

9. The memory circuit of claim 1, further comprising a secondary memory system for storing an address of the defective memory cell.

10. The memory circuit of claim 1, further comprising a flash memory for storing an address for the defective memory cell.

11. The memory circuit of claim 1, wherein each IO circuit is associated with one or more memory cells.

12. A method for providing redundancy in a memory system comprising:
providing a memory segment defined by a plurality of memory cells arranged in one or more columns and one or more rows, each memory cell communicating with one of a pair of complementary bit-lines and with a word-line;
detecting a defective memory cell in said memory segment;
identifying and selecting a redundant bit-line from among a plurality of redundant bit-lines; and
replacing the defective memory cell by directing a redundant word-line pulse to a redundant memory cell communicating with the selected redundant bit line.

13. The method of claim 12, wherein the redundant bit-line and the redundant word-line communicate with the redundant memory cell.

14. The method of claim 12, wherein the step of identifying at least one redundant bit-line further comprises identifying the redundant memory cell for receiving a word-line pulse destined for the defective memory cell.

15. The method of claim 12, wherein the step of identifying at least one redundant bit-line further comprises selecting a redundant bit-line as a function of an address of the defective memory cell.

16. The method of claim 15, wherein the redundant word-line pulse is the word-line pulse associated with the defective memory cell.

17. The method of claim 12, further comprising providing a controller for receiving an address of the defective memory cell and an address of the redundant memory cell.

18. The method of claim 12, further comprising providing a first controller for directing an output from the redundant bit-line to an IO circuit associated with said defective memory cell.

19. The method of claim 12, further comprising providing a multiplex circuit associated with the defective memory cell for communicating with the least one redundant bit-line.

20. The method of claim 12, wherein the memory segment defines a static random access memory system.

21. The method of claim 12, further comprising providing a secondary memory for storing an address of the defective memory cell.

22. The method of claim 21, wherein the secondary memory is one of a flash memory or a random access memory.

23. The method of claim 12, further comprising associating an IO circuit with the defective memory cell.

24. The method of claim 12, wherein the redundant bit cell replaces the defective memory cell without replacing a memory segment or a memory array containing the defective memory cell.

25. The method of claim 12, wherein the redundant bit cell replaces the defective memory cell without replacing a memory column containing the defective memory cell.

26. The method of claim 12, wherein the redundant bit cell replaces the defective memory cell without replacing a memory row containing the defective memory cell.

27. An apparatus for detecting an addressing error in data stored in a static ram configuration, the apparatus comprising:
a plurality of main memory array for storing data, each memory array having at least one memory cell in communication with a word-line and one of a pair of complementary bit-lines;
a plurality of redundant bit-cells to replace a defective memory cell;
a control circuit configured to transmit a replacement word signal to a selected redundant bit-line from the plurality of redundant bit-lines, the selected redundant bit-line and a replacement word line defining a redundant memory cell;
wherein the control circuit further includes a flash memory for storing the address of the defective memory cell and a comparator for directing the replacement signal to the redundant bit-line.

28. The apparatus of claim 27, wherein the replacement signal is a word-line pulse.

29. The apparatus of claim 27, wherein the replacement signal is a redundant word line pulse substantially identical to the word-line pulse associated with the defective memory cell.

30. The apparatus of claim 27, wherein the memory array defines a memory column.

31. The apparatus of claim 27, wherein the memory array is a part of a static random access memory.

* * * * *